United States Patent [19]

Bai

[11] Patent Number: 5,003,201
[45] Date of Patent: Mar. 26, 1991

[54] OPTION/SEQUENCE SELECTION CIRCUIT WITH SEQUENCE SELECTION FIRST

[75] Inventor: Jong K. Bai, Busanzichal-Si, Rep. of Korea

[73] Assignee: Goldstar Semiconductor Co., Ltd., Seoul, Rep. of Korea

[21] Appl. No.: 372,605

[22] Filed: Jun. 28, 1989

[30] Foreign Application Priority Data

Jun. 30, 1988 [KR] Rep. of Korea ............... 8111/1988

[51] Int. Cl.$^5$ ........................................ H03K 17/296
[52] U.S. Cl. .................................. 307/465; 307/480; 307/481; 377/76; 377/79
[58] Field of Search ............... 307/463, 465, 468–469, 307/480–481, 272.2; 377/75–76, 79

[56] References Cited

U.S. PATENT DOCUMENTS

| | | | |
|---|---|---|---|
| 3,824,480 | 7/1974 | Eshraghian | 377/76 X |
| 4,027,175 | 5/1977 | Hurst | 307/465 X |
| 4,366,393 | 12/1982 | Kasuya | 307/465 X |
| 4,568,841 | 2/1986 | Mayhew | 307/480 X |
| 4,802,120 | 1/1989 | McCoy | 377/76 X |
| 4,873,671 | 10/1989 | Kowshik et al. | 377/76 X |
| 4,877,974 | 10/1989 | Kawai et al. | 307/480 X |

*Primary Examiner*—David Hudspeth

[57] ABSTRACT

A circuit is provided having a plurality of flip flops ($F_l$-$F_n$) that are serially connected for executing sequential operations under the control of a clock. The outputs ($Q_l$-$Q_n$) of the flip flops ($F_l$-$F_n$) are connected to corresponding inputs ($I_l$-$I_n$) of a binary decoder and the sequential outputs ($O_1$-$O_2$) of the binary decoder execute the sequential selection. However, when an optional operation is selected during the execution of the sequential selection, a first switch switches the state of the clock terminals of the flip flops to a "high level" so that the flip flops memorize the state of the interrupted sequence selection. Subsequently, the option selection is carried out by the manipulation of a set of switches. Upon completion of the option selection, the first switch is switched back so that the execution of the interrupted sequence selection continues.

1 Claim, 2 Drawing Sheets

OPTION/SEQUENCE SELECTION CIRCUIT WITH SEQUENCE SELECTION FIRST

FIELD OF THE INVENTION

The present invention is directed to an option/sequence selection circuit having a sequence selection option first, and in particular, to a memory system for controlling processes in factory automation.

BACKGROUND ART

A conventional option selection circuit, as shown in FIG. 1, includes a power source (VDD) connected to terminals on one side of a set of switches ($S_1$-$S_n$) and a power source (VSS) connected to the opposite terminals on the other side of the switches $S_1$-$S_n$). The common terminals of the switches ($S_1$-$S_n$) are connected to inputs $I_1$-$I_n$) of a binary coder (1). When a user selectively switches on the power source (VDD) or (VSS), the inputs of the binary decoder (1) are applied with a "high level" (=VDD) or a "low level" (=VSS) respectively so that the corresponding outputs make an option selection.

In FIG. 2 a conventional sequence selection circuit is arranged so that the outputs of each of the flip flops are connected to the inputs of the subsequent flip flip and the connection nodes between the outputs and the clock terminals of the flip flops ($F_1$-$F_n$) are connected to the corresponding inputs of the binary decoder (1). Sequential clock pulse inputs to the flip flops develop outputs in the order of 000-000 , 000-001, 000-010 which are supplied to the inputs of the binary decoder (1). Accordingly, the outputs of the binary decoder (1) are developed in a sequential order for making a sequence selection.

In FIG. 3, a conventional combination circuit includes an option selection circuit as shown in FIG. 1 and a sequence selection circuit as shown in FIG. 2. In this conventional combination circuit, a clock pulse is applied to a flip flop ($F_1$), the inverse output ($\overline{Q_1}$) of the flip flop and the output of inverter ($I_1$) are connected to a NAND gate ($N_1$), the output of the NAND gate ($N_1$) is connected to a NAND gate ($N_2$) via a flip flop ($F_2$) and an inverter ($I_2$), the output of the NAND gate ($N_2$) is connected to a NAND gate ($N_3$) via a flip flop ($F_3$) and an inverter ($I_3$). The connections continue in the same manner as described above in order to form a synchronous binary counter (3) of flip flops ($F_1$-$F_n$), inverters ($I_1$-$I_{n+1}$) and NAND gates ($N_1$-$N_{n-1}$). The outputs ($Q_1$-$Q_n$) of the flip flops ($F_1$-$F_n$) are respectively connected to corresponding inputs of the binary decoder (1) and the common terminals of a set of switches ($S_1$-$S_n$). The set of switches ($S_1$-$S_n$) are so arranged that the terminals on one side are connected to a power supply (VDD) while the terminals on the other side are connected to a power supply (VSS). The flip flip ($F_1$) includes a main flip flop (4), a slave flip flop (5) and an inverter ($I_n$) as shown in FIG. 4.

In the circuit described above, an option selection causes the set of switches ($S_1$-$S_n$) to apply inputs to the binary decoder for execution while a sequence selection causes the set of switches ($S_1$-$S_n$) to be set to a "low level" state (=VSS) and presets all of the flip flops so that the synchronous binary counter (3) performs binary counting in response to the application of the clock pulse. The binary counting is given to the inputs of the decoder (1) for being output at the sequential outputs.

SUMMARY OF THE INVENTION

Conventionally, only an option selection circuit or a sequence selection circuit has been supplied to users. However, the conventional circuits are often inconvenient in the application of the users' specific needs.

In a combination circuit for option/sequence selection, there is a need for repeatedly presetting the flip flops before a sequence selection is resumed. Additionally, the restoration of execution to the state of the sequence selection, which was interrupted by an option selection, has been previously impossible.

The present invention however enables the execution of the sequence selection interrupted by an option selection to be resumed after the completion of the option.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENTS OF THE PRESENT INVENTION

In FIGS. 1-5 numeral and literal codes indicate the following: Numeral 1 indicates a binary decoder, numeral 2 indicates an asynchronous binary counter, numeral 3 indicates a synchronous binary counter, numeral 4 indicates a master flip flop, numeral 5 indicates a slave flip flop, literal codes $F_1$-$F_n$ indicate flip flops, literal codes $I_1$-$I_{n+2}$ indicate inverters, literal codes $N_1$-$N_n$ indicate NAND gates, literal codes $S_1$-$S_n$ indicate switches, literal code $A_1$ indicates an AND gate, literal codes $T_1$-$T_{k+2}$ indicate transmission gates, and literal codes $O_1$ and $O_2$ indicate OR gates.

Figure 1:
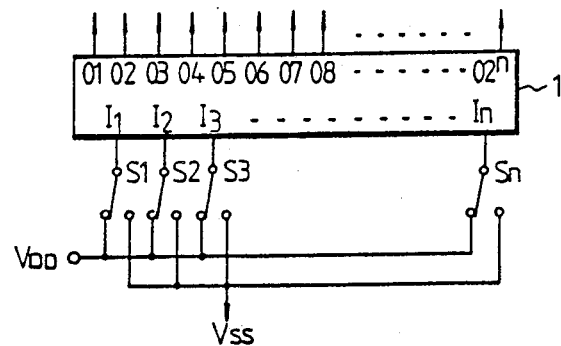
FIG. 1 illustrates a conventional option selection circuit.
Figure 2:
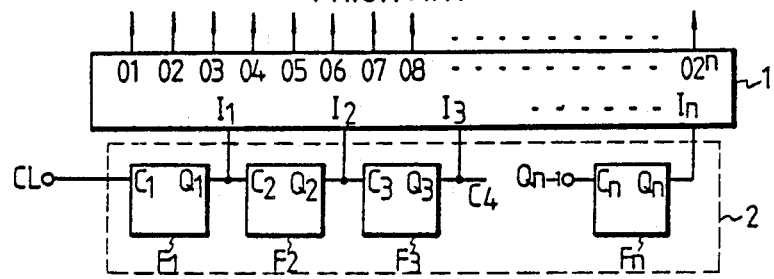
FIG. 2 illustrates a conventional sequence selection circuit.
Figure 3:
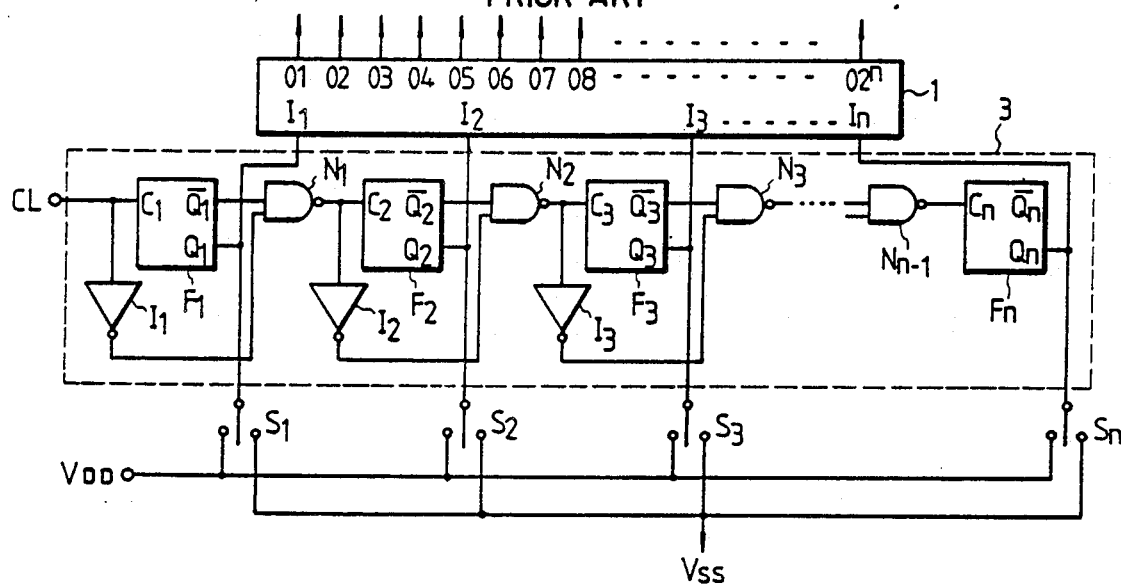
FIG. 3 illustrates a combination of an option selection circuit and a sequence selection circuit.
Figure 4:
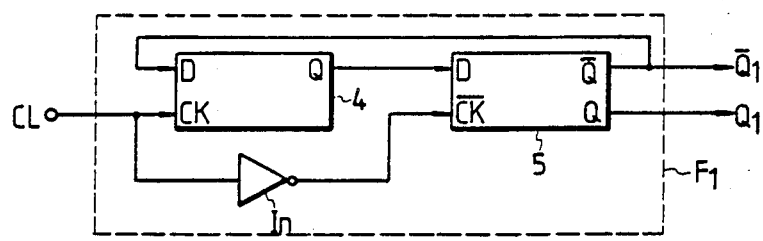
FIG. 4 illustrates an internal block diagram of a general T type master-slave flip flop in the conventional art.
Figure 5:
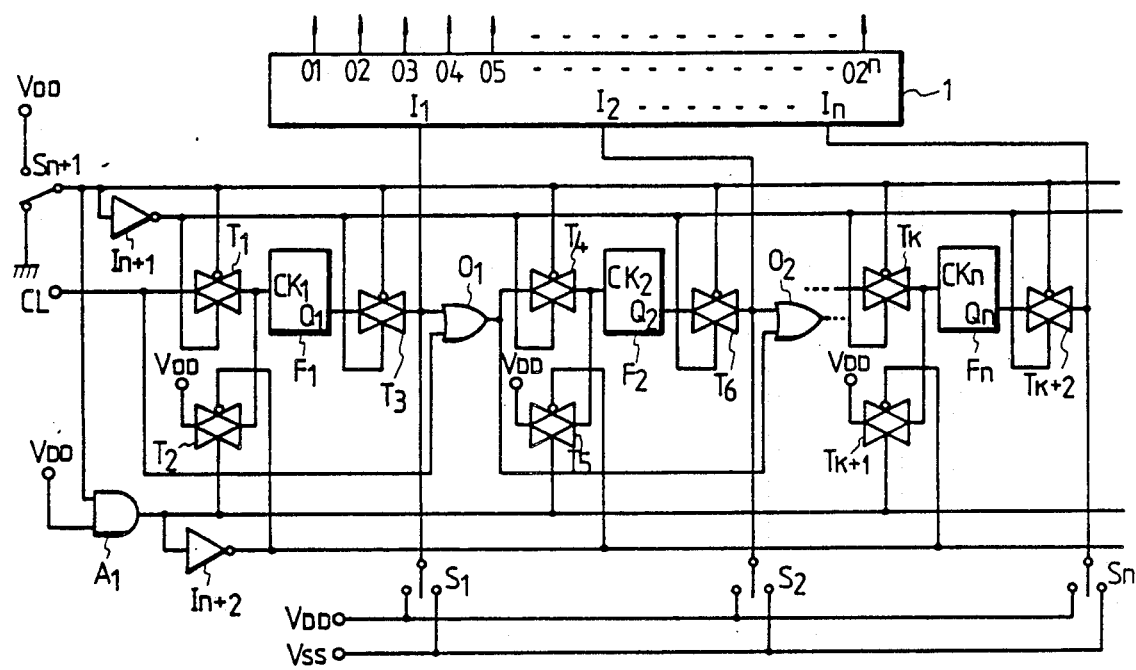
FIG. 5 illustrates a combination of option and sequence selection circuits with sequence selection first.

In a circuit for an embodiment of the present invention as illustrated in FIG. 5, the common terminal of switch ($S_{n+1}$) is connected to a power supply (VDD) and the output of an inverter ($I_{n+1}$) is connected to the control sections of transmission gates ($T_1$, $T_3$, $T_4$, $T_6$ . . . $T_{k+1}$), a clock pulse is applied to the clock terminal ($Ck_1$) and the input of an OR gate ($O_1$) simultaneously via the transmission gate ($T_1$). An AND gate ($A_1$), which is connected to the common terminal of the switch ($S_{n+1}$) and the power supply (VDD) at its inputs, is connected at its output to the clock section of flip flop ($F_1$) via the transmission gate ($T_2$), which is controlled by the output of an inverter ($I_{n+2}$) and has the output of the AND gate ($A_1$) input thereto. The output ($Q_1$) of flip flop ($F_1$) is connected via the transmission gate ($T_3$), which is controlled by the switch ($S_{n+1}$) and the output of the inverter ($I_{n+1}$), with a binary decoder (1) and the input of an OR gate ($O_1$). The output of the OR gate ($O_1$) is connected with the transmission gate ($T_4$) which is controlled by the switch ($S_{n+1}$) and the inverter ($I_{n+1}$), and the input of the OR gate ($O_2$).

The same manner of connection is repeated to form a multi-staged connection. The common terminals of a set of switches ($S_1$-$S_n$), whose terminals on one side are connected to the power supply (VDD) while the terminals on the other side are connected to the power supply (VSS), are respectively connected with the inputs of a binary decoder (1) and the inputs of the OR gates ($O_1$, $O_2 \ldots O_{n-1}$). The flip flops are constructed as T type master-slave flip flops similar to the construction of FIG. 4.

The operation of the present embodiment will be described as follows. When the switch ($S_{n+1}$) is grounded and a low level is produced, a clock pulse is applied to the clock section of the flip flop ($F_1$) via the transmission gate ($T_1$) for actuating the transmission gate ($T_3$) which is connected to the output of the flip flop ($F_1$). Thereby, the output of the T type master slave flip flop ($F_1$) changes the state at the leading edge of the input clock pulse so that a ½ demultiplied clock pulse is output to the binary decoder (1) and to the next flip flop ($F_2$) through the OR gate ($O_1$) and the transmission gate ($T_4$). Furthermore, since the flip flop ($F_2$) is ½ demultiplied, a ¼ clock output from the original clock output is applied via the transmission gate ($T_6$) to the input of the binary decoder (1) and to the input of OR gate ($O_2$). This process is repeated in a similar manner until the last flip flop ($F_n$) is reached.

Accordingly, input signals in a sequential order of 000-000→000---001→000---010→000---011→---- are input to the binary decoder ($1_y$) so that the binary decoder (1) may perform the function of a sequence selector. In such a state, the connection of the switch ($S_{n+1}$) to the power supply (VDD) cuts off the transmission gates ($T_1$, $T_3$, $T_4$, $T_6 \ldots T_{k+1}$) Additionally, the outputs of the clock (CL) and the flip flops ($F_1$-$F_n$) are cut off and the output of the AND gate ($A_1$) becomes a "high level" for actuating the transmission gates ($T_2$, $T_5 \ldots T_{k+1}$). Thereby, the clock sections of the flip flops ($F_1$-$F_n$) are stabilized at a high level potential by the power supply (VDD) so that the flip flops ($F_1$-$F_n$) maintain the switches ($S_1$-$S_n$) at the same state (=sequence selection state) as the state before the power supply (VDD) is connected. After execution of an option selection by the switches ($S_1$-$S_n$), grounding of the switch ($S_{n+1}$) retrieves the sequence selection operation from the memory of the flip flops ($F_1$-$F_n$) for resuming the operation.

The present embodiment provides an effective method that executes an option selection while executing a sequence selection and for subsequently returning to the operation of the sequence selection interrupted by the option as memorized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. An option/sequence selection circuit having a sequence selection first option, comprising:

first switching means for switching between a first power source and ground and developing a first control signal and a first inverted control signal indicative of an option selection and a sequence selection;

combining means for performing a logical AND function between said first power source and said first control signal and developing a second control signal and a second inverted control signal;

clock means for developing a control clock pulse;

a plurality of sequentially connected stages having an input node and an output node, said control clock pulse being supplied to said input node of the first stage, each stage including, a flip flop having a clock input and an output, a first transmission gate having a first node connected to the clock input of the flip flop, a second node connected to the output node of a preceding stage, a third node connected to the inverted control terminal and a control node connected to said control terminal, a second transmission gate having a first node connected to the output of the flip flop, a second node for developing a second transmission gate output, a third node connected to the inverted control terminal and a control node connected to said control terminal, a stage switch for switching between said first power source and a second power source, the common terminal of said stage switching being connected to said transmission gate output, an OR gate connected to said transmission gate output and said input node for performing a logical OR function; and binary decoding means for receiving said transmission gate outputs from each of said stages at a plurality of consecutive inputs which are controlled by said stage switches for each of said stages and developing a plurality of outputs from the selection circuit.

* * * * *